United States Patent
De Maglie et al.

(10) Patent No.: US 10,361,552 B2
(45) Date of Patent: Jul. 23, 2019

(54) SOLID STATE POWER CONTROLLER HAVING SEMI-ANALOG OVERCURRENT PROTECTION

(71) Applicant: Liebherr-Elektronik GmbH, Lindau (DE)

(72) Inventors: Rodolphe De Maglie, Wangem im Allgaeu (DE); Erich Riedisser, Sigmarszell (DE); Nejat Mahdavi, Lindau (DE)

(73) Assignee: Liebherr-Elektronik GmbH, Lindau (DE)

( * ) Notice: Subject to any disclaimer, the term of this patent is extended or adjusted under 35 U.S.C. 154(b) by 386 days.

(21) Appl. No.: 15/394,594

(22) Filed: Dec. 29, 2016

(65) Prior Publication Data

US 2017/0194783 A1    Jul. 6, 2017

(30) Foreign Application Priority Data

Jan. 4, 2016   (DE) .................. 10 2016 000 034

(51) Int. Cl.
| | |
|---|---|
| *H02H 3/00* | (2006.01) |
| *H02H 3/087* | (2006.01) |
| *H03K 17/56* | (2006.01) |
| *H02H 3/093* | (2006.01) |

(52) U.S. Cl.
CPC .......... *H02H 3/087* (2013.01); *H02H 3/0935* (2013.01); *H03K 17/56* (2013.01)

(58) Field of Classification Search
USPC ...................... 361/87, 93.1, 93.2, 94, 97, 98
See application file for complete search history.

(56) References Cited

U.S. PATENT DOCUMENTS

| | | | |
|---|---|---|---|
| 3,624,490 A | 11/1971 | Fisher | |
| 4,539,618 A * | 9/1985 | Stich | H02M 7/1555 361/94 |
| 4,589,052 A * | 5/1986 | Dougherty | H02H 3/0935 361/94 |
| 4,658,323 A | 4/1987 | Dougherty | |
| 4,782,422 A | 11/1988 | Jones et al. | |
| 5,627,717 A * | 5/1997 | Pein | H02H 3/0935 361/115 |
| 7,633,727 B2 * | 12/2009 | Zhou | H02H 1/0015 361/42 |

(Continued)

FOREIGN PATENT DOCUMENTS

| | | |
|---|---|---|
| DE | 1513409 C3 | 6/1979 |
| DE | 102005046980 A1 | 4/2007 |

*Primary Examiner* — Ronald W Leja
(74) *Attorney, Agent, or Firm* — McCoy Russell LLP

(57) ABSTRACT

The present disclosure relates to a solid state power controller, comprising: a power switch for interrupting a line; a current sensor for measuring a current flow on the line; and a control unit for controlling the power switch and that is configured to prevent a time-dependent overcurrent on the line on the basis of the current measured by the current sensor, wherein the control unit comprises a counter that is adapted to increment a count when the measured current is larger than a threshold value and to decrement the count when the measured current is smaller than the threshold value; and wherein the power switch is adapted to interrupt the line when the counter reaches or exceeds a predefined count.

11 Claims, 4 Drawing Sheets

(56) References Cited

U.S. PATENT DOCUMENTS

| | | | |
|---|---|---|---|
| 8,023,235 B2* | 9/2011 | Bilac | H02H 1/0015 324/500 |
| 8,913,363 B2* | 12/2014 | Takata | H02M 1/32 323/282 |
| 2007/0133134 A1* | 6/2007 | Kilroy | H02H 1/0015 361/5 |
| 2008/0174928 A1 | 7/2008 | Liu et al. | |
| 2008/0212248 A1* | 9/2008 | Zhu | H02M 1/32 361/97 |
| 2010/0127677 A1* | 5/2010 | Ohshima | B60Q 11/00 323/282 |
| 2013/0343096 A1* | 12/2013 | Stuler | H02M 1/32 363/21.02 |
| 2014/0347774 A1* | 11/2014 | Uehara | H02H 3/0935 361/87 |
| 2017/0194783 A1* | 7/2017 | De Maglie | H02H 3/087 |
| 2018/0294643 A1* | 10/2018 | Donath | H02H 1/0007 |

* cited by examiner

SOLID STATE POWER CONTROLLER HAVING SEMI-ANALOG OVERCURRENT PROTECTION

CROSS REFERENCE TO RELATED APPLICATION

This application claims priority to German Patent Application No. 10 2016 000 034.1, entitled "Solid State Power Controller Having Semi-Analog Overcurrent Protection," filed Jan. 4, 2016. The entire contents of the above-cited application is hereby incorporated by reference for all purposes.

TECHNICAL FIELD

The present disclosure relates to a solid state power controller, and to a solid state power controller arrangement whose primary tasks are to protect electrical devices and their wiring from power overloads in dependence on time and to couple the electrical devices to or to decouple them from a power supply system.

BACKGROUND AND SUMMARY

A solid state power controller, SSPC, typically makes use of a digital microcontroller (or a DSP) to implement the required functionality with the aid of a software program. In this respect, it is the main object of this solid state power controller to switch electrical energy to a load and to interrupt the current flow in a time-dependent manner in the case of an overload.

Solid state power controllers of the prior art are in this respect programmed with the aid of their microcontrollers so that they have an $I^2t$ characteristic. This means that the product of the square of the current I and of the time t to reach a critical energy level is constant so that the time at which a disconnect occurs is inversely proportional to the square of the current. In other words, the apparatus is adapted to disconnect quickly at high currents, but to carry out a disconnect later at low currents. The advantage of this is that no disconnect is produced on a moderate overcurrent if the current is reduced or leaves the overcurrent range after a short time. This reduces the occurrence of disruptive disconnects, whereby incorrect tripping actions of disconnects are minimized. In addition, the solid state power controllers known in the prior art have a functionality that includes a memory function so that a preceding overload that has not affected a disconnect cooperates, after a transient departure from the overload range, with a second overload current that occurs briefly thereafter such that a disconnect of a line takes place faster than a disconnect that occurs only with respect to the presence of the second overload current (memory effect). This brings along the advantage that the thermal heating of the device to be protected by the solid state power controller can be mapped.

In summary, the solid state power controller therefore has the two main tasks for connecting or interrupting loads in an electric circuit as well as the protection of the cables connected to the load. The loads can in particular be electrical control actuators in aircraft, with a thermal circuit breaker still being very widespread in this environment. The protection in this respect comprises a short-circuiting and an overload observation with respect to an $I^2t$ curve of the cable.

It is necessary in aircraft to design the actuator power management unit (APMU) such that a protection of the cables connected to the APMU is provided. This protection should simultaneously also replace the behavior of a fuse which preferably has the typical $I^2t$ behavior and the previously used mechanical power interruption circuits. Advantages with respect to the flexibility and to a higher reliability are looked for here and the possibility of lowering costs is also seen.

As already stated further above, conventional solid state power controllers (SSPCs) use digital control units such as a microcontroller or a digital signal processor (DSP) to implement the required functions in the form of a software program. However, this architecture results in an increased error frequency and in an increase with respect to the certification effort for the implemented software since it has to be subjected to a particularly exact testing or certification in aircraft.

U.S. 2008/0174928 A1 discloses a solid state power controller that implements a $I^2t$ function by using a capacitor and a counter, with the first capacitor being charged several times when an overcurrent event occurs. The counter in this respect implements a count related to the number of charge cycles of the first capacitor to detect a shutdown condition. In addition, the circuit comprises a discharge module that is connected to the shutdown module and that comprises a resistor and a second capacitor, wherein an electrical parameter that is linked to the count drops over time when using the resistor and the second capacitor.

It is disadvantageous in the above-described model from the prior art that the capacitors used herein are of central importance and the overall accuracy and the long-term stability depends on these components. In addition, a thermal behavior is not taken into account precisely or reliably enough on the drop of the count.

The count is moreover only updated when an overload case is measured. The total energy balance that also looks at states in the non-overload case is not used.

It is therefore a goal of the present disclosure to provide a solid state power controller (SSPC) that overcomes the above-stated disadvantages and simultaneously achieves a $I^2t$ function without the presence of a microcontroller or the like.

The solid state power controller accordingly comprises a power switch for interrupting a line, a current sensor for measuring a current flow on the line, and a control unit for controlling the power switch and that is adapted to prevent an overcurrent on the line on the basis of the current measured by the current sensor. The control unit comprises a counter that is adapted to increment or decrement a count when the measured current is larger than a threshold value and to decrement or increment the count when the measured current is smaller than the threshold value, with the power switch being adapted to interrupt the line when the counter reaches or exceeds a predefined count limit value.

It is clear to the skilled person that the calculation operation (incrementing or decrementing) in the case of a current that is larger than the threshold value has to be different from the case in which the current is smaller than the threshold value. A pair of incrementing and decrementing accordingly always results.

The count of the counter may not be changed for the case in which the measured current $I_M$ is exactly equal to the threshold value $I_{TH}$.

Unlike solid state power controllers known in the prior art, the value of the count directly depends on the measured current in the case of an overcurrent event. More reliable and more exact conclusions on the actual state of the line to be monitored thereby result since the charging of capacitors or the like cannot produce unwanted differences.

The power switch of the claimed solid state power controller substantially has the ability to disconnect or to connect the line to be monitored. In a separated state, the flow of a current through the line is suppressed, whereas in a connected state of the line a current flow through the line is possible. The current sensor measures the current strength of the current flowing on the line and forwards the measured current to the control unit. This is adapted to control the power switch, that is, the disconnecting or the closing of the line. This is done on the basis of the current measured by the current sensor in that a counter increments a count when the measured current is larger than a threshold value or decrements the count when the measured current is smaller than the threshold value. On a reaching or exceeding of a predefined count limit value, the power switch interrupts the line so that current can no longer flow through the line.

The control unit may comprise a comparator that is connected to the threshold value and to the measured current and that outputs a signal to an input of the counter that determines the count direction (incrementing or decrementing) of the count. An upward count direction corresponds to an incrementing, whereas a downward count direction corresponds to a decrementing. The comparator in this respect is a reliable variant to implement the required function of the control unit. It is possible by the wiring with the threshold value and with the measured current to generate a signal at the output of the comparator that adopts a defined state depending on whether the measured current is larger than the threshold value. The state is typically a high value or a low value of a voltage range. This signal is then forwarded to an input of the counter whose wiring decides on an incrementing or decrementing of the count. The output of the comparator for the case $I_M=I_{TH}$ does not play any role, that is it can adopt a high value or a low value.

In accordance with a further optional further development of the present disclosure, the frequency of the counter at which it increments or decrements its count is related to a difference of the measured current from the threshold value, with this relationship being reflected by the expression (threshold value−measured current)$^2$ to implement the typically required $I^2t$ characteristic of the solid state power controller.

The greater the difference of the measured current from the threshold value, the faster an incrementing or a decrementing of the counter takes place. If, for example, the measured current is considerably above the threshold value, an incrementing of the counter takes place quickly one after the other so that the count reaches or exceeds the predefined count limit value relatively quickly. If, in contrast, the measured current is just below the threshold value, this produces a decrementing of the count, with the time intervals between the individual decrementing steps being large.

In accordance with a further modification of the present disclosure, the control unit furthermore comprises a differentiator that is wired to the measured current and to the threshold value and that outputs a difference value between the threshold value and the measured current; a multiplier that multiplies the difference value output by the differentiator by itself (squares it); and a voltage frequency converter that converts the value output by the multiplier into a pulse sequence of a corresponding frequency, with the pulse sequence being forwarded to a clock input (CLK input) of the counter so that an incrementing or decrementing of the count takes place on each pulse.

The differentiator forms the difference between the measured current and the threshold value that is multiplied by itself in the multiplier. The sign of the difference is of no significance since the multiplier squares the difference value of the measured current and of the threshold value. The output of the multiplier is connected to the uF converter.

The voltage-to-frequency converter is a component that outputs a pulse sequence in dependence on its input voltage, the intervals of said pulse sequence being inversely proportional to the input voltage value. At a high input voltage value of the voltage-to-frequency converter, a pulse sequence having a high frequency is accordingly output, whereas at a low input voltage value of the voltage-to-frequency converter, a pulse sequence of low frequency is output. The pulse sequence output by the voltage-to-frequency converter is input at a clock input of the counter such that the counter carries out an incrementing or a decrementing at each of the pulses output by the multiplier.

Overall, this means that with a larger difference of the measured current from the threshold value, the count of the counter changes very fast, whereas with a small difference of the measured current and of the threshold value, the count of the counter only changes slowly over time, with the $I^2t$ characteristic being implemented by the squaring with the aid of the multiplier.

In accordance with a further embodiment of the present disclosure, the control unit furthermore comprises a current-to-voltage converter to convert the current measured by the current sensor into a voltage value. This current-to-voltage conversion is in this respect preferably carried out before a supply of a signal to a comparator and to a differentiator so that a voltage value is supplied to the differentiator and to the comparator that corresponds to the measured current.

In accordance with a further development of the present disclosure, the power switch for disconnecting a line is adapted to close the line on a falling below of the predefined count limit value or on a status below the predefined count limit value. A current can thereby flow through the line monitored by the solid state power controller provided that the count limit value of the counter has not been exceeded.

The counter may have a smallest count that can no longer be further decremented, with the smallest count being zero in one example.

In accordance with a further optional embodiment of the present disclosure, the control unit is adapted to map an $I^2t$ characteristic, with this mapping taking place without using a microcontroller in one example. This brings about advantages since it is not necessary to subject the software of a microcontroller or of a DSP to a certification test in critical applications; for example on a use of a solid state power controller in an aircraft.

It is additionally possible that the solid state power controller does not comprise a microcontroller and/or substantially only comprises the components of the paragraphs above describing the solid state power controller.

In accordance with a variation of the present disclosure, the power switch is bidirectionally conductive and may comprise an IGBT, a MOSFET, a Si semiconductor and/or a SiC semiconductor.

The present disclosure furthermore comprises a solid state power controller arrangement that comprises at least two of the above-described solid state power controllers, with a first solid state power controller being present in a line that serves the conducting of a current to a load, and with a second solid state power controller being present in a line that serves the leading away from the load. This two-channel architecture allows the detection of a ground fault or of other defects that are based on a differential current imbalance without any greater effort. One solid state power controller is therefore inserted into the positive line and one solid state power controller into the negative line of a load to be monitored and/or to be connected with the solid state power controller.

Further advantages, details and features of the present disclosure will become clear with reference to the following discussion of the Figures.

DETAILED DESCRIPTION

Figure 1:
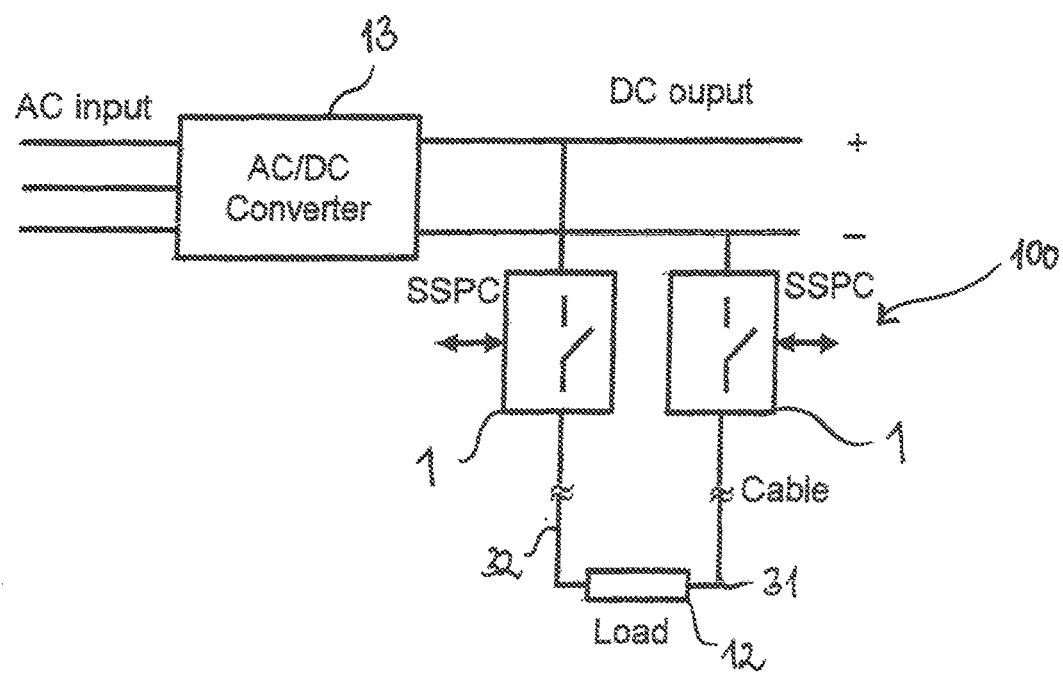
FIG. 1 shows the solid state power controller in accordance with the present disclosure in an assembly with a power distribution apparatus.

FIG. 1 shows the use of a solid state power controller 1 for the protection of lines that are arranged between a load 12, typically an actuator, and a power distribution apparatus. An AC voltage is input in an AC/DC converter 13 and is output in a DC voltage converted therefrom. The load 12 is connected at the voltage dropping between the two lines. In this respect, a solid state power controller 1 is provided both in a line 31 that conducts the current to the load 12 and in a line 32 that conducts the current away from the load 12.

This is referred to as a solid state power controller assembly in accordance with a two-channel architecture since a solid state power controller is present in both channels (lines) of the load.

The solid state power controller 1 in this respect has the behavior of a fuse with its typical $I^2t$ characteristic and typically serves to replace the previously used mechanical power interrupters. In addition to its main function of a switching on and off, the solid state power controller prevents a catching fire or a scorching of the cable arranged between the solid state power controller and the load during a short circuit or during overload phases.

The arrangement shown in FIG. 1 of two solid state power controllers in the respective lines that connect the load to the voltage source allows the recognition of defects on the basis of a differential current imbalance.

Figure 2:
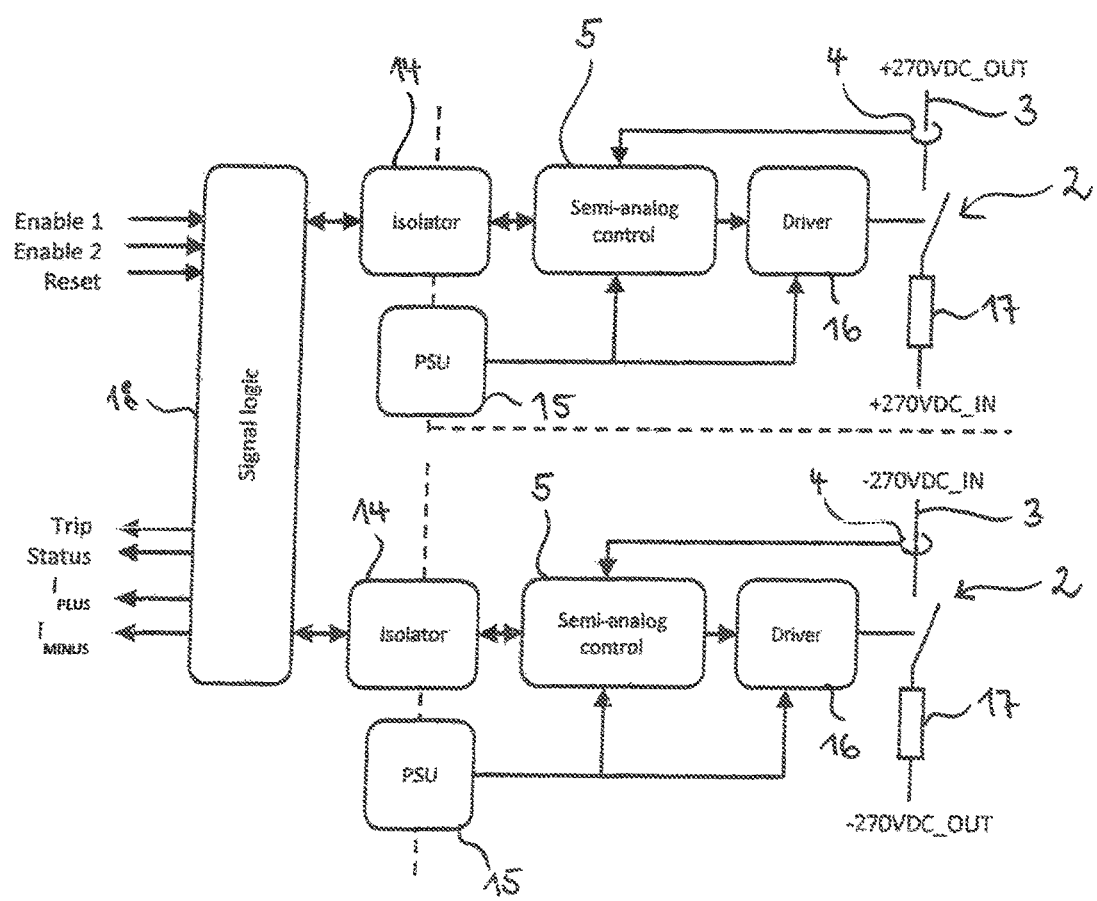
FIG. 2 shows a circuit diagram for representing the basic principle of the solid state power controller in accordance with the present disclosure.

FIG. 2 shows a diagram that shows the functional blocks of the solid state power controller shown in FIG. 1 in detail. Since a solid state power controller is present in FIG. 1 both at the positive voltage line and at the negative voltage line, the operation of the solid state power controller will be explained in the following with reference to only one of the solid state power controllers that are essentially the same. The presence of a solid state power controller in only one line is sufficient for the essential features of the solid state power controller.

A line 3 to be switched and/or to be monitored by a solid state power controller is sampled with the aid of a current sensor 4 for the current flowing in the line 3. The current sensor 4 therefore measures the current flowing in the line 3. Said current is forwarded to a control unit 5 that decides, with the aid of a control mechanism discussed in detail below, whether a power switch 2 disconnects or connects the line 3. The power switch 2 has a driver 16 to carry out the disconnect or the connection of the line 3. A power supply unit (PSU) 15 in this respect supplies both the control unit 5 and the driver 16 of the power switch 2 with power. Furthermore, the control unit 5 is coupled to a signal logic 18 via an isolator 14, the signal logic being able to communicate with a higher order control instance. The signal logic 18 can, for example, receive a reset signal from this instance to reset all the settings or an enable signal to carry out the solid state controller operation. Conversely, the signal logic 18 of this higher ranking control instance can communicate different states such as the measured current on the line 3 or the disconnect of the line 3 by the solid state power controller 1 due to an excessive current on the line 3.

In order also to be prepared for the case of a defect or of a malfunction of the solid state power controller, a conventional fuse 17 is additionally provided in the line 3. This fuse 17 is, however, optional and can be a safety fuse or another conventional fuse.

A galvanic isolation is provided with the aid of the isolator 14 via which the control unit 5 communicates with the signal logic 18. In the event of a short-circuit, it ensures that the signal logic cannot be impaired thereby.

Figure 3:
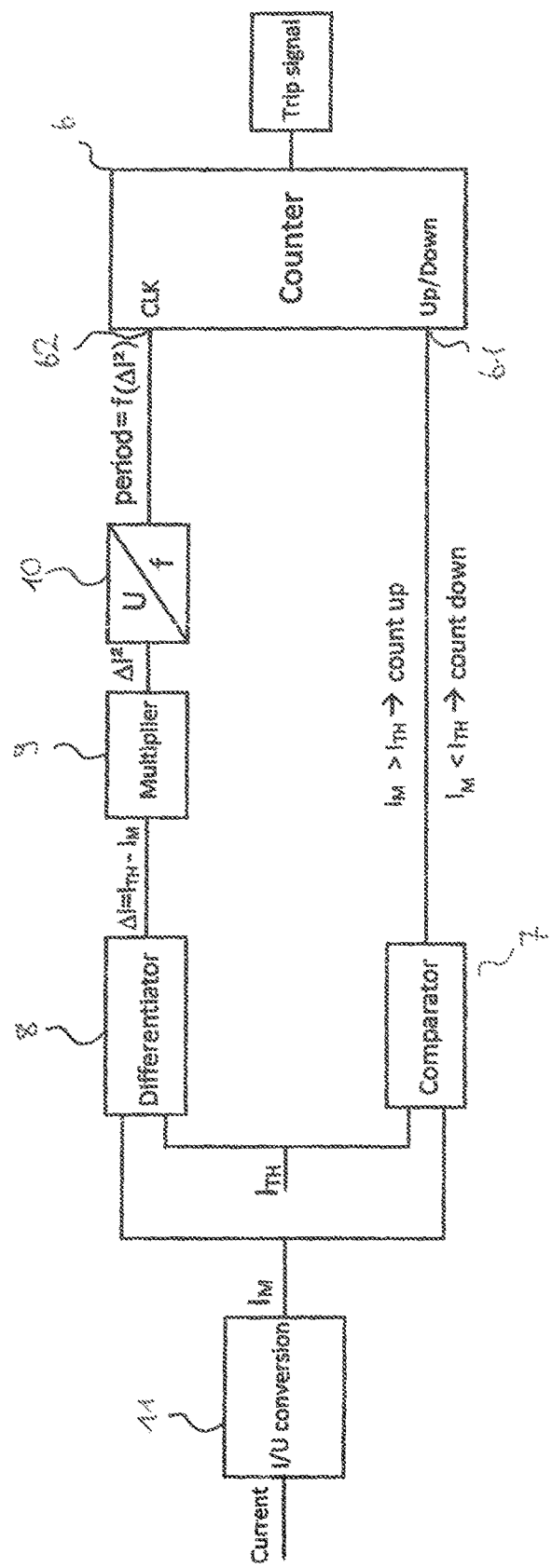
FIG. 3 shows a circuit diagram of the semi-analog control unit of the solid state power controller in accordance with the present disclosure.

FIG. 3 shows a block diagram of the control unit 5. It can be recognized that the current of the line 3 measured by the current sensor 4 is converted by a current-to-voltage converter 11 into a voltage value that corresponds to the measured current in the line 3 and is represented by the symbol "$I_M$". A threshold value "$I_{TH}$" can additionally be recognized that is forwarded together with the measured current to a comparator 7 and to a differentiator 8.

In this respect, the comparator 7 is connected such that it carries out a simple comparison of the two input values $I_M$ and $I_{TH}$ and outputs a specific signal value (high value or low value) depending on which of the two input signals is the larger. It is fixed in cooperation with a counter module 6 (also referred to as a counter), that has an input 61 fixing the count direction, that the counter 6 counts up on a measured current $I_M$ larger than the threshold value $I_{TH}$ and the counter 6 counts down on a measured current $I_M$ that is smaller than the threshold value $I_{TH}$. If the measured current $I_M$ is therefore larger than the threshold value $I_{TH}$, the counter 6 increments its count; otherwise, the counter 6 decrements its count. For the case that the measured current exactly corresponds to the threshold value $I_{TH}$, the counter 6 can either increment or decrement its count. This is of no significance since in this case the count is not changed.

In summary, the counter 6 makes its counting direction dependent on whether the measured current $I_M$ is larger or smaller than the threshold value $I_{TH}$.

The measured current $I_M$ and the threshold value $I_{TH}$ furthermore also enter into the differentiator 8. This differentiator 8 determines the difference of the two signals supplied to it. A voltage level is therefore applied to the output of the differentiator that can be expressed in a mathematical sense as: $\Delta I = \text{Threshold } I_{TH} - \text{Measured current } I_M$. The sign of this difference is not significant for the following observation since the result $\Delta I$ obtained from the differentiator 8 is squared with the aid of a multiplier 9 so that the result $\Delta I$ obtained from the differentiator 8 can now be summarized as $(\Delta I)^2$.

The squared difference $\Delta I^2$ of the measured current $I_M$ from the measured value $I_{TH}$ is then supplied to a voltage-to-frequency converter 10. This component outputs a pulse sequence, with the interval of the output pulses depending on the amount of the input voltage level. A high voltage level at the input of the voltage-to-frequency converter 10, for example, produces a pulse sequence whose intervals are small, that is that have a high frequency. A low voltage level, in contrast, produces a pulse sequence whose intervals from one another are large, that is that have a low frequency. This is shown mathematically in that the period of the pulses is a function dependent on $\Delta I^2$.

The output of the voltage-to-frequency converter 10 is connected to an input 62 of the counter 6. The input 62 is described by "CLK" and designates an input of the counter at which a count is either incremented or decremented on a presence of a pulse, depending on the wiring of the input 61 which is indeed directly connected to the output of the comparator 7.

It is therefore possible to say that the greater the difference between the measured current $I_M$ and the threshold value $I_{TH}$, the faster an incrementing/decrementing takes place by the counter 6 or the correspondingly higher the frequency at which it takes place.

If the counter 6 reaches a specific predefined count, the so-called count limit value "trip limit", the counter 6 outputs a signal to disconnect the connection by the power switch 2. This signal is called a shutdown or trip signal.

Figure 4:
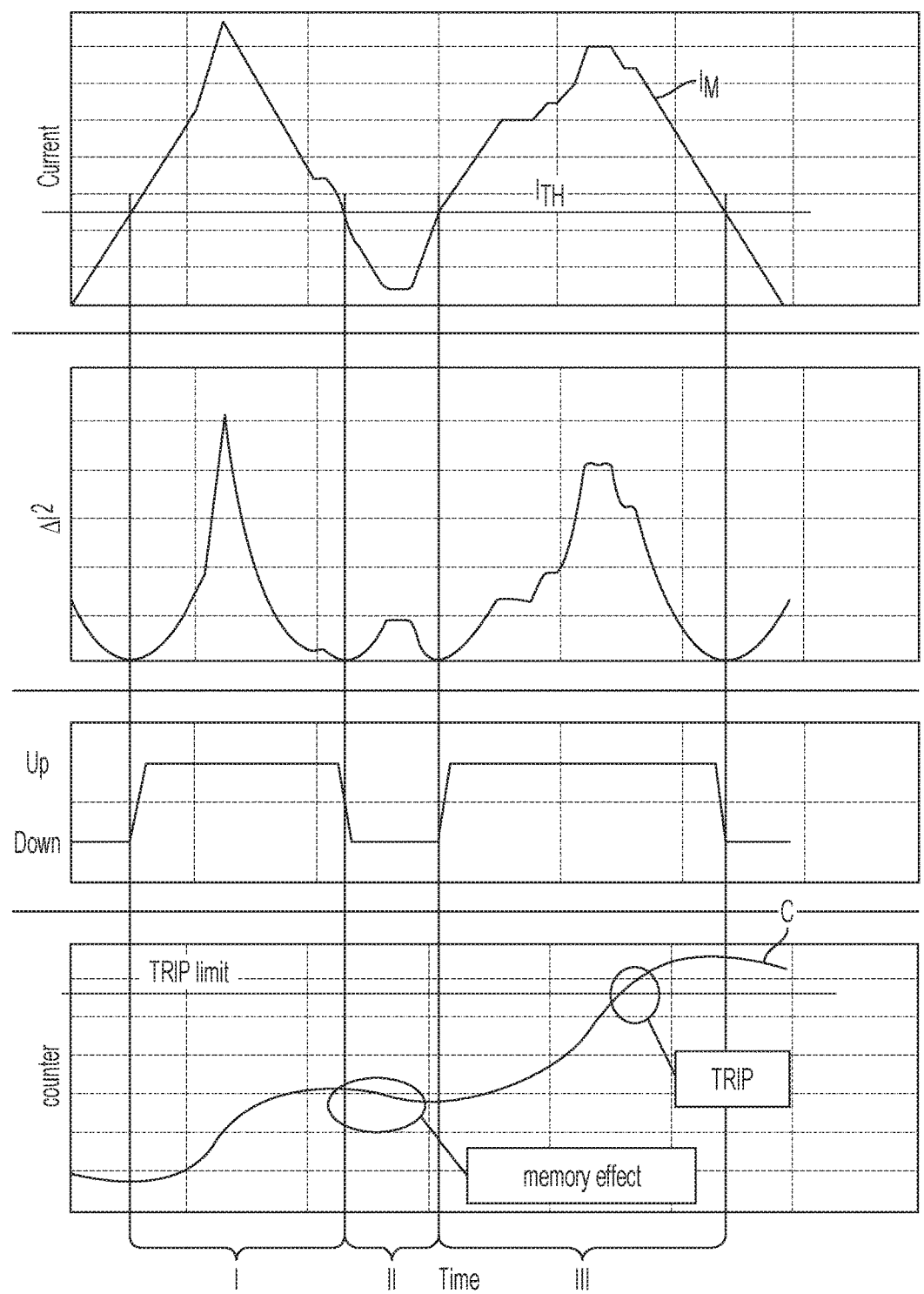
FIG. 4 shows a diagram overview for representing the different signal states of the control unit of the solid state power controller in accordance with the present disclosure.

FIG. 4 shows some signal diagrams that simplify the understanding of the routines in the control unit 5. Here, the signal curves are taken at some selected positions in the control unit 5 and are entered over time. Three sections are essentially shown here with reference to which the operation of the solid state power controller in accordance with the present disclosure will be explained.

The topmost of the four diagrams shown shows the measured current $I_M$ and the threshold value $I_{TH}$. As already explained in connection with FIG. 3, these two signals are deducted from one another with the aid of the differentiator and the squaring of the difference amount of these two signals $\Delta I^2$ takes place with the aid of the multiplier 9.

This is reproduced visually in the representation below it (e.g., in the second plot from the top) and substantially corresponds to a signal curve such as is present at the output of the multiplier 9 or at the input of the voltage-to-frequency converter 10.

Below this, in turn, (e.g., the third plot from the top) is a signal curve such as is present at the output of the comparator 7. It can be recognized here that the signal is a high value for regions in which the measured signal $I_M$ is larger than the threshold value $I_{TH}$ and is a low value in the reverse case. In this respect, the input 61 of the counter 6 is adapted such that it produces an incrementing on a high-value signal and a decrementing of the counter in the counter 6 on a low-value signal.

The bottommost representation in FIG. 4 in this respect shows the variation of the count C with reference to the time development of the measured current curve IM shown in FIG. 4 as well as the count limit value "trip limit" on the reaching or exceeding of which a trip command is output to the power switch 2 to disconnect the line 3.

Starting with the time zone marked as section 1 that is shown with the help of vertical lines throughout all diagrams, the count has a specific value. Since the measured current $I_M$ is larger than the threshold value $I_{TH}$, an upward count direction of the counter 6 takes place, it is therefore incremented. The frequency of the incrementation steps is substantially determined in this respect by the difference of the measured current $I_M$ from the threshold value $I_{TH}$, since the counter either increments or decrements its count in dependence on $\Delta I^2$. As long as the measured current $I_M$ is larger than the threshold value $I_{TH}$, the count increases continuously, but rises the fastest in those regions in which the difference of the measured current $I_M$ from the threshold value $I_{TH}$ is the largest.

If the measured current $I_M$ falls below the threshold value $I_{TH}$, no direct resetting of the counter value to 0 to a different initialization value takes place, but rather a decrementing of the reached count value C is carried out in dependence on the difference of the measured current $I_M$ and of the threshold value $I_{TH}$. This can be recognized in section II of the diagrams shown in FIG. 4.

A certain memory effect therefore results by the selected function for measured currents $I_M$ exceeding the threshold $I_{TH}$ in the past.

An exceeding of the measured current $I_M$ above the threshold value $I_{TH}$ can again be recognized in section III with reference to the signal curves shown in FIG. 4. This produces a similar behavior of the count as in section I. Since the exceeding of the measured current $I_M$ lasts a long time and overall produces an exceeding of the count limit value "trip limit" in connection with the exceeding of the threshold value $I_{TH}$ observed in section I, a trip signal is sent from the counter 6 to the power switch 2 on an exceeding or reaching of the count limit value "trip limit" that initiates a disconnect of the line 3.

Since the count is not just reset to a starting value, the desired $I^2t$ characteristic is precisely mapped with its memory function.

The advantages of the above-described solid state power controller can be seen in a particularly high reliability and in the low costs that are incurred for the implementation of the solution. Unlike a digital solution in which a microcontroller programmed with software takes over the operation, technological risks and the development effort are significantly reduced in this respect. The increased certification effort in software for the event of an application of the solid state power controller in an aircraft can also not be underestimated that does not occur with the solution in accordance with the present disclosure or only occurs to a greatly reduced effect.

The invention claimed is:

1. A solid state power controller, comprising:
a power switch for interrupting a line;
a current sensor for measuring a current flow on the line; and
a control unit for controlling the power switch, the control unit adapted to prevent an overcurrent on the line on a basis of a measured current measured by the current sensor,
the control unit comprising a counter that is adapted a) to increment or b) to decrement a count when the measured current is larger than a threshold value and a) to decrement or b) to increment the count when the measured current is smaller than the threshold value, wherein
the power switch is adapted to interrupt the line when the counter reaches or exceeds a predefined count limit value.

2. The solid state power controller in accordance with claim 1, wherein the control unit comprises a comparator that is wired to the threshold value and to the measured current and that outputs a signal to an input of the counter that determines the count direction of the counter, and wherein the control unit is further adapted to prevent the overcurrent on the line dependent on time.

3. The solid state power controller in accordance with claim 1, wherein the frequency of the counter at which the latter increments or decrements its count is related to a difference of the measured current from the threshold value, with this relationship being reflected by the expression $$(\text{Threshold value}(I_{TH}) - \text{Measured current}(I_M))^2.$$

4. The solid state power controller in accordance with claim 1, wherein the control unit further comprises:
   a differentiator that is wired to the measured current and to the threshold value and that outputs a difference value between the threshold value and the measured current;
   a multiplier that multiplies the difference value output by the differentiator by itself; and
   a voltage-to-frequency converter that converts the value output by the multiplier into a pulse sequence of a corresponding frequency; wherein
   the pulse sequence is forwarded to a CLK input of the counter such that an incrementing or a decrementing of the count takes place on each pulse.

5. The solid state power controller in accordance claim 1, wherein the control unit furthermore comprises a current-to-voltage converter to convert the current measured by the current sensor into a voltage value.

6. The solid state power controller in accordance with claim 1, wherein the power switch for interrupting the line is adapted to close the line on a falling below of or on a status below the predefined count limit value.

7. The solid state power controller in accordance with claim 1, wherein the counter has a smallest count that cannot be further decremented; and wherein said smallest count is zero.

8. The solid state power controller in accordance with claim 1, wherein the control unit is adapted to map an $I^2t$ characteristic without the use of a microcontroller.

9. The solid state power controller in accordance with claim 1, wherein the solid state power controller does not comprise a microcontroller.

10. The solid state power controller in accordance with claim 1, wherein the power switch is bidirectionally conductive and comprises an IGBT, a MOSFET, a Si semiconductor and/or a SiC semiconductor.

11. A solid state power controller arrangement, comprising:
   a first solid state power controller comprising:
      a first power switch for interrupting a first line;
      a first current sensor for measuring a current flow on the first line; and
      a first control unit for controlling the first power switch, the first control unit adapted to prevent an overcurrent on the first line on a basis of a measured current measured by the first current sensor, the first control unit comprising a first counter that is adapted a) to increment or b) to decrement a count when the measured current is larger than a threshold value and a) to decrement or b) to increment the count when the measured current is smaller than the threshold value, wherein the first power switch is adapted to interrupt the first line when the first counter reaches or exceeds a predefined count limit value; and
   a second solid state power controller comprising:
      a second power switch for interrupting a second line;
      a second current sensor for measuring a current flow on the second line; and
      a second control unit for controlling the second power switch, the second control unit adapted to prevent an overcurrent on the second line on a basis of a measured current measured by the second current sensor, the second control unit comprising a second counter that is adapted a) to increment or b) to decrement a count when the measured current is larger than the threshold value and a) to decrement or b) to increment the count when the measured current is smaller than the threshold value, wherein the second power switch is adapted to interrupt the second line when the second counter reaches or exceeds the predefined count limit value,
   wherein the first solid state power controller is present in the first line that conducts current to a load; and wherein the second solid state power controller is present in the second line that conducts current away from the load.

* * * * *